(12) United States Patent
Kwon et al.

(10) Patent No.: US 7,642,167 B2
(45) Date of Patent: Jan. 5, 2010

(54) SON MOSFET USING A BEAM STRUCTURE AND METHOD FOR FABRICATING THEREOF

(75) Inventors: Il-Woong Kwon, Incheon (KR); Yong-Soo Lee, Daejeon (KR); Hee-Chul Lee, Daejeon (KR)

(73) Assignee: Korea Advanced Institute of Science & Technology (KR)

( * ) Notice: Subject to any disclaimer, the term of this patent is extended or adjusted under 35 U.S.C. 154(b) by 400 days.

(21) Appl. No.: 11/362,244

(22) Filed: Feb. 24, 2006

(65) Prior Publication Data

US 2006/0189086 A1 Aug. 24, 2006

(30) Foreign Application Priority Data

Feb. 24, 2005 (KR) .................. 10-2005-0015337

(51) Int. Cl.
*H01L 21/336* (2006.01)

(52) U.S. Cl. .................. 438/284; 257/E29.117

(58) Field of Classification Search .......... 438/284; 257/E29.117

See application file for complete search history.

(56) References Cited

U.S. PATENT DOCUMENTS

2004/0235262 A1* 11/2004 Lee et al. .................. 438/411
2006/0105506 A1* 5/2006 Shen .................. 438/149

* cited by examiner

*Primary Examiner*—Matthew Smith
*Assistant Examiner*—Walter H Swanson
(74) *Attorney, Agent, or Firm*—The Belles Group, P.C.

(57) ABSTRACT

The present invention relates to a SON (Silicon-On-Nothing) MOSFET having a beam structure and an inverter using thereof and the method for fabricating thereof to increase the efficiency and performance of a MOSFET. A method for fabricating the SON MOSFET according to the present invention comprises the steps of (a) patterning a passivation layer on a substrate, (b) doping boron on the substrate, (c) removing the patterned passivation layer, (d) forming the beam structure on the substrate by anisotropical etching on the region not doped with boron of the substrate, (e) depositing an insulating material on the substrate having the beam structure, and (f) deposing an electrode material on the disposed insulating material.

10 Claims, 8 Drawing Sheets

(a)

(b)

SON MOSFET USING A BEAM STRUCTURE AND METHOD FOR FABRICATING THEREOF

This non-provisional application claims priority under 35 U.S.C. § 119 to Patent Application No. 10-2005-0015337 filed in the Republic of Korea on Feb. 24, 2005, the entire contents of which are hereby incorporated by reference.

BACKGROUND OF THE INVENTION

1. Field of the Invention

The present invention relates to a semiconductor device, and more specifically to a SON (Silicon-On-Nothing) MOSFET having a beam structure and an inverter that uses the SON MOSFET as well as a method for fabricating the SON MOSFETs and the inverter so as to increase the performance and efficiency of the MOSFET.

2. Description of the Background Art

Recently, one chip technology has been rapidly developed to integrate multiple semiconductor devices.

In particular, as the integration intensity of the MOSFET has increased and the size of MOSFETs has decreased, the potential barrier of the MOSFET's gate and drain has decreased, because a lateral electric field due to a drain voltage becomes relatively larger than a vertical electric field due to a gate voltage. It makes the effective channel length of the MOSFET become shorter than that of MOSFETs having long channel length. This phenomenon causes heavy coupling of the gate voltage and the drain voltage (known as a Short Channel Effect).

This Short Channel Effect makes device characteristics worse. Moreover, off-current of the MOSFET tends to increase due to this Short Channel Effect.

To solve these problems, various methods like SOI (Silicon-On-Insulator) and SON (Silicon-On-Nothing) MOSFETs have been introduced. For the SOI type, the MOSFET is electrically insulated from the bulk by making it on a SOI wafer which uses a $SiO_2$ layer to insulate top silicon and bottom silicon wafers. The SON type has been implemented by forming a cavity by selectively implanting nitrogen into a predetermined region of the semiconductor substrate or by forming an air cavity through lateral etching on the side of the gate.

However, the conventional SOT and SON MOSFETs have some problems. That is, the price of a SOI wafer is much higher than that of a normal wafer, and the performance of the SOI MOSFET is lower than that of MOSFETs using the SON structure. For SON type MOSFETs, it is not suitable for mass production because the fabrication process is so complex and high level accuracy in alignment is required to form each electrode.

SUMMARY OF THE INVENTION

Accordingly, one object of the present invention is to solve the problems and disadvantages of the background art.

Another object of the present invention is to provide a SON (Silicon-On-Nothing) MOSFET using a beam structure implemented to modify process complexity of the conventional SON structure and to minimize the short channel effect by forming a MOSFET on the beam structure which is made on the semiconductor substrate.

Another object of the present invention is to provide a method of fabricating a SON MOSFET using a beam structure to maximize the productivity by implementing SON structure with a simple process available for mass production.

Also, it is to provide a method of fabricating an inverter device using SON MOSFETs. Further, it is to implement an efficient multi-level logic circuit to be applicable to all systems using the MOSFET.

A method for fabricating SON MOSFETs using beam structure according to the present invention to accomplish the objectives comprises the steps of (a) patterning a passivation layer on a substrate; (b) doping boron on the substrate; (c) removing the patterned passivation layer; (d) forming the beam structure on the substrate by anisotropical etching on the region not doped with boron; (e) depositing an insulating material on the substrate having the beam structure; and (f) depositing an electrode material on the deposited insulating material.

Step (d) may include a bulkmicromachining process that etches a U shaped cavity on the substrate for forming the gate/source/drain electrodes of the SON MOSFET.

The gate insulating material comprises at least one of $SiO_2$, $Si_3N_4$, $Al_2O_3$, $Y_2O_3$, $ZrO_2$, $HfO_2$, $Ta_2O_5$, and $TiO_5$.

The electrode material comprises at least one of silicon, polysilicon, or metal.

A SON MOSFET is manufactured in accordance with the method according to the present invention which uses beam structure.

A method of fabricating an inverter device using SON MOSFETs according to the present invention to accomplish the objectives comprises the steps of: (a) patterning a first passivation layer on a substrate; (b) doping boron on the substrate; (c) removing the patterned first passivation layer; (d) forming a first beam structure on the substrate by anisotropical etching on the region not doped with boron; (e) depositing a first insulating material on the substrate having the first beam structure; (f) depositing an electrode material on the deposited first insulating material; (g) removing the first insulating material and the first electrode material on the first beam structure; (h) forming a wafer by depositing silicon on the substrate; (i) patterning a second passivation layer on the wafer; (j) doping boron on the wafer; (k) removing the patterned second passivation layer; (l) forming a second beam structure on the wafer by anisotropical etching on the region not doped with boron; (m) depositing a second insulating material on the wafer having the second beam structure; and (n) depositing a second electrode material on the deposited second insulating material, wherein the region of the first beam structure and the region not doped with boron for forming the second beam structure are at least partially aligned.

The first beam structure and the second beam structure are formed perpendicularly.

An inverter device comprising a structure that a unit device of two MOSFETs is integrated in accordance with the method according to the present invention.

Accordingly, the present invention is capable of solving the Short Channel Effect which is generated as the channel length is decreased because the SON (Silicon-On-Nothing) structure can be implemented with a simple process. Also, the size of a device can be remarkably reduced because Short Channel Effect is minimized. Moreover, productivity may be maximized due to the relatively simple process of the self aligning method.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

Figure 1:
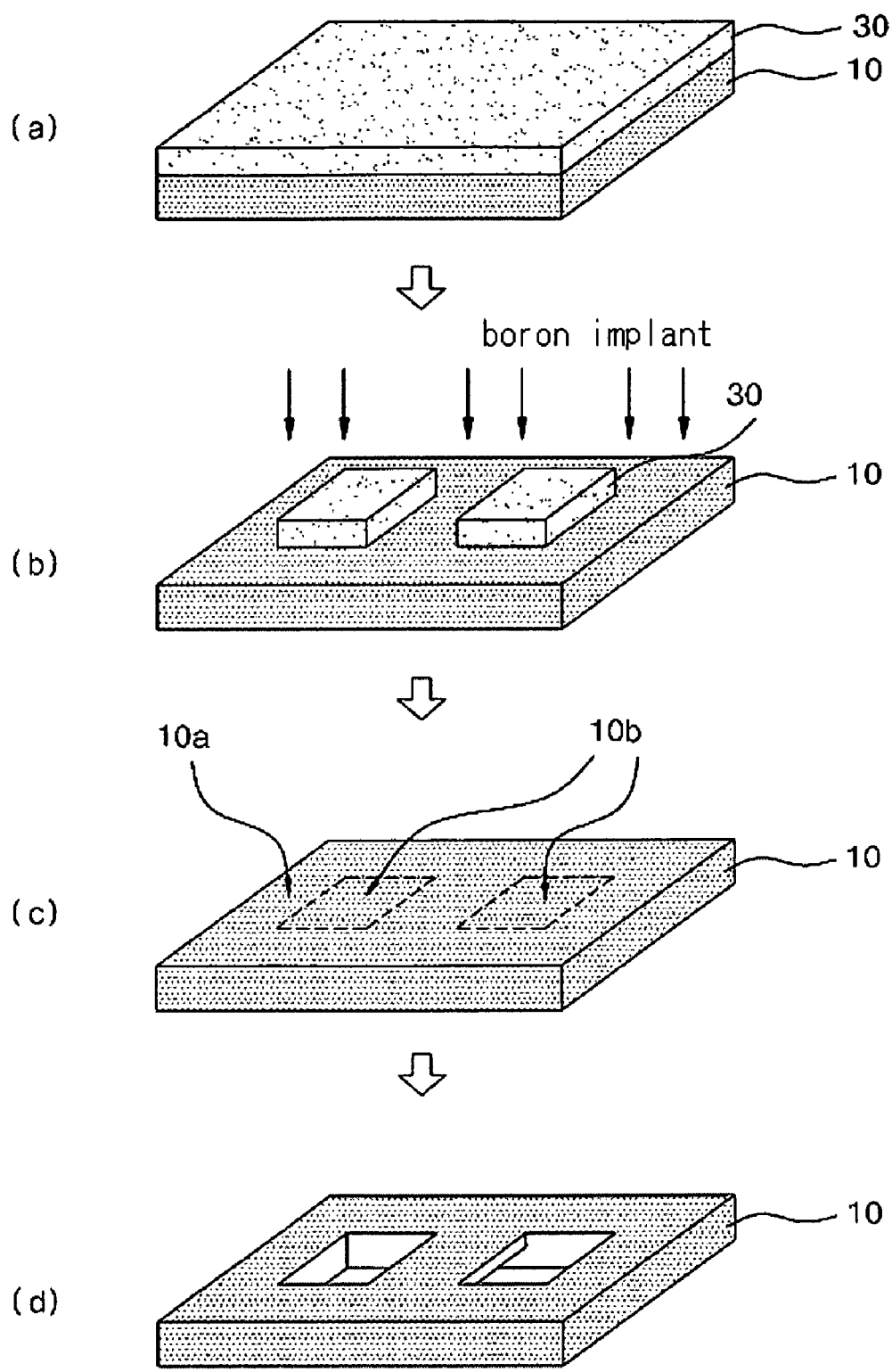
FIG. 1 is a diagram for representing the process of forming a beam structure to fabricate a SON MOSFET according to the present invention.
Figure 2:
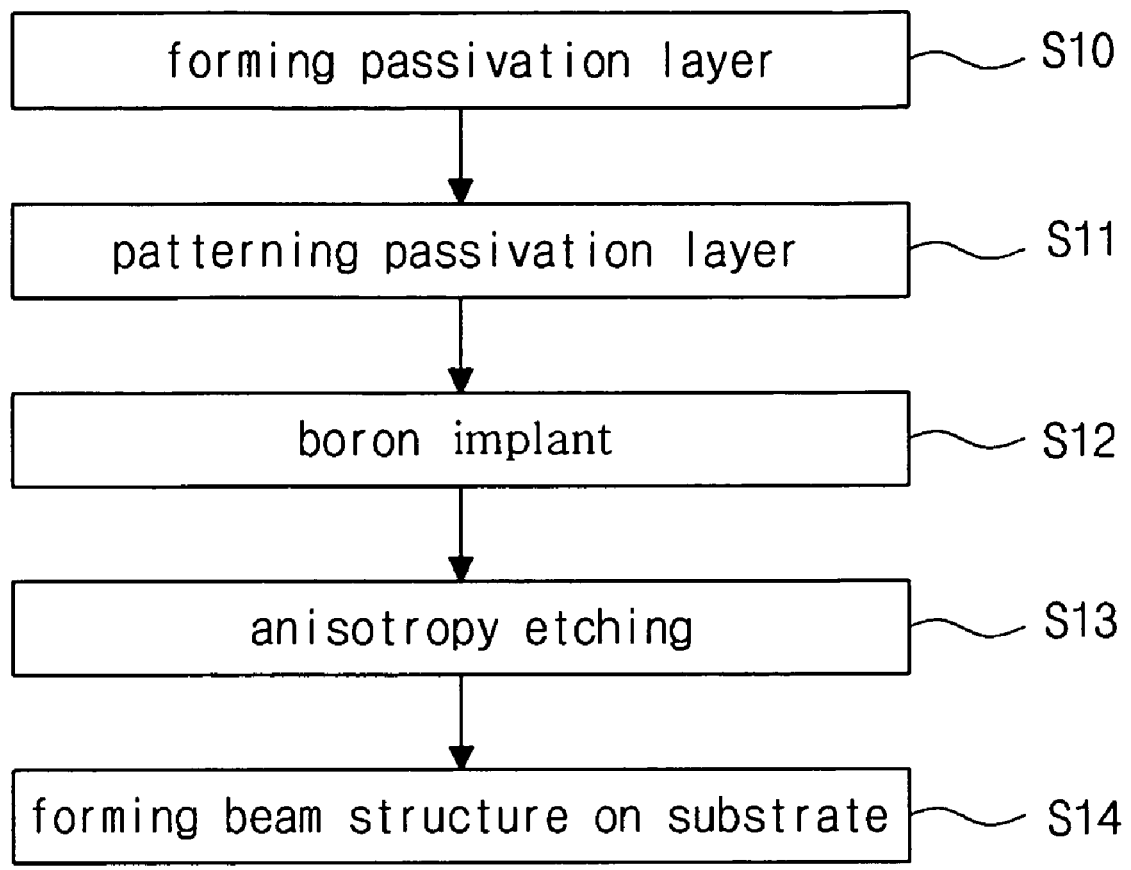
FIG. 2 is a flow chart for explaining the process shown in FIG. 1.
Figure 3:
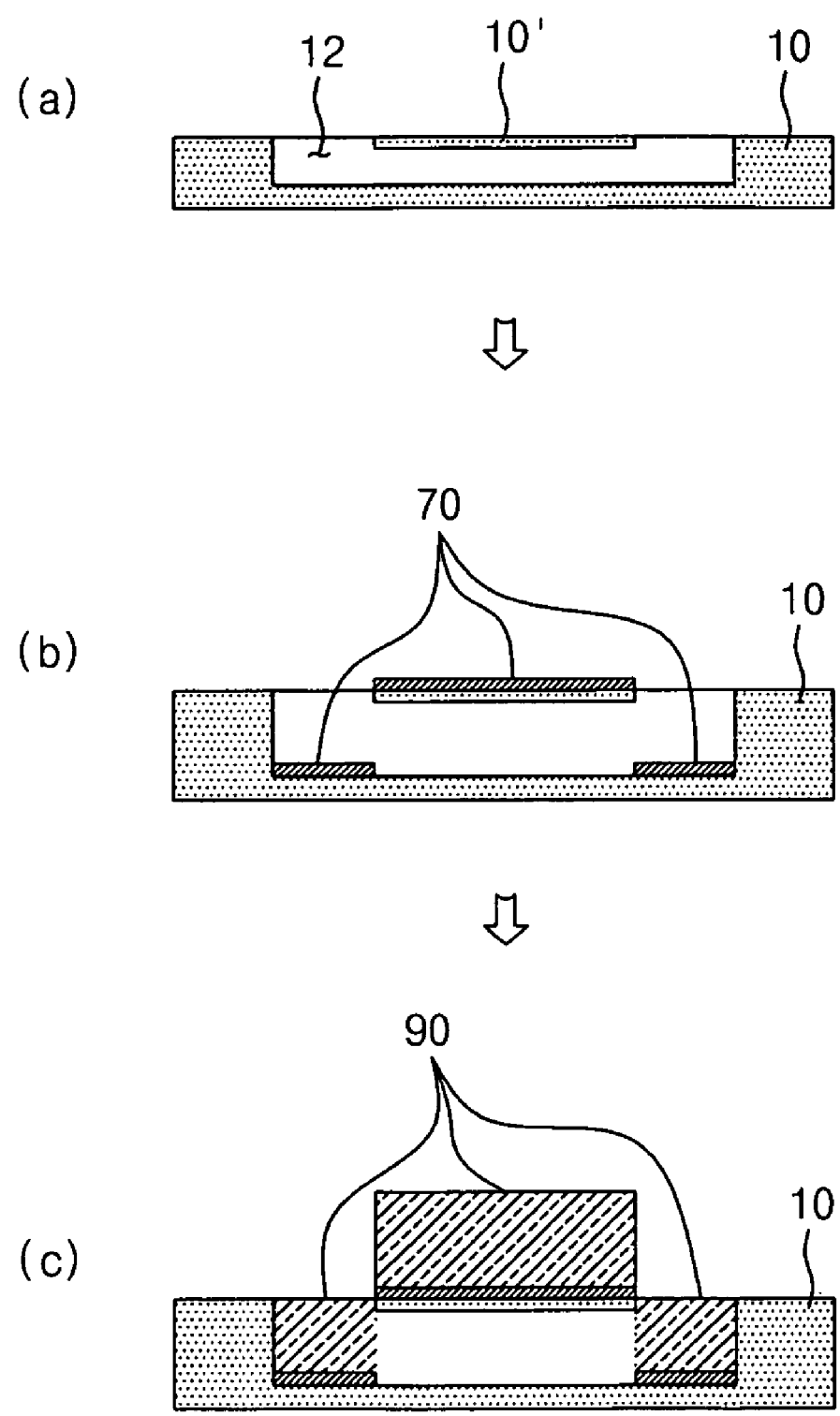
FIG. 3 is a diagram for representing the process of fabricating the SON MOSFET by forming gate, source and drain electrodes on the wafer according to FIG. 1.
Figure 4:
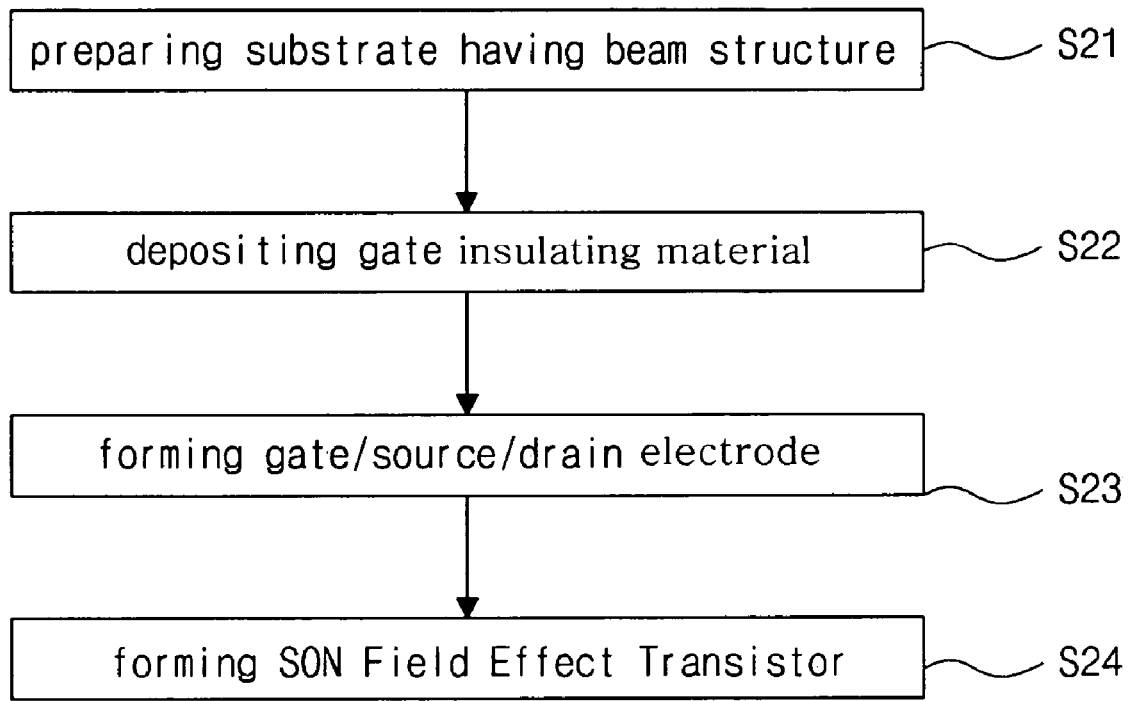
FIG. 4 is a flow chart for explaining the process shown in FIG. 3.
Figure 5:
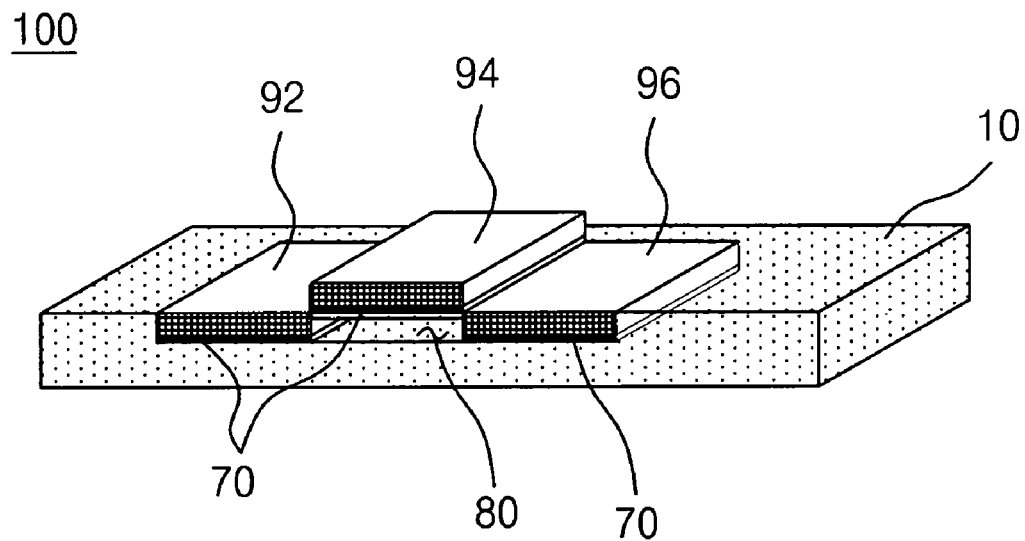
FIG. 5 is a diagram for partly representing the SON MOSFET according to the present invention formed by the process of FIG. 1 and FIG. 3.

FIG. 1 is a diagram for representing the process of forming a beam structure to fabricate a SON MOSFET according to the present invention, FIG. 2 is a flow chart for explaining the process shown in FIG. 1, FIG. 3 is a diagram for representing the process of fabricating the SON MOSFET by forming a gate, source and drain electrodes on the beam structure according to FIG. 1, FIG. 4 is a flow chart for explaining the process shown in FIG. 3, and FIG. 5 is a diagram for partly representing the SON MOSFET according to the present invention formed by the process of FIG. 1 and FIG. 3.

As shown in above FIGS, the present invention provides a method of fabricating the SON MOSFET with the beam structure to increase the efficiency and performance of the MOSFET through reducing the Short Channel Effect by making an air cavity between the drain and source electrodes.

The SON MOSFET according to the present invention is fabricated by the process step comprised of forming the beam structure using Bulkmicromachining technology on the surface of the substrate shown in FIG. 1 and FIG. 2, and fabricating the SON MOSFET by sequentially forming the insulating material and electrodes of the MOSFET as shown in FIG. 3 and FIG. 4.

<The Process Step of Forming the Beam Structure>

Referring FIG. 1 and FIG. 2, FIG. 1a and FIG. 1b represent the boron implantation after forming and patterning of passivation layer on the semiconductor substrate, FIG. 1c represents the state of the substrate after boron implantation and passivation layer removal, and FIG. 1d represents the beam structure formed by Bulkmicromachining after an anisotropy etching process.

Referring FIG. 1a and FIG. 1b, a passivation layer 30 is formed on a semiconductor substrate 10 and then the passivation layer 30 is patterned on the semiconductor substrate 10 (S10, S11). The passivation layer 30 is for preventing Boron doping under the passivation layer 30 in the Boron doping process.

Such patterning method for the passivation layer is a Photolithography process, a well known technology, which is performed by the process that forms a photo-resist pattern and performs etching according to the photo-resist pattern. Hence, the detailed description about it will be abbreviated.

Then, a doping is performed by Diffusion or Ion Implantation of boron on the substrate 10 on which the passivation layer 30 is patterned (s12).

When the passivation layer 30 is eliminated after the doping, the surface of the semiconductor substrate 10 may be divided into two parts. One part 10a is a boron doped part as shown in FIG. 1(c) and the other part 10b is a part on which boron is not doped due to the passivation layer 30.

The boron doped part 10a is made to block etching in the etching process of following step, while the part 10b on which boron is not doped is a part to be etched.

Then, as shown in FIG. 1(d), the beam structure having cavity 12 (see FIG. 3(a)) of U shape is formed on the substrate 10, by performing anisotropy etching on the part 10b on which boron is not doped through Bulkmicromachining on the semiconductor substrate 10 (S13, S14).

In a closing step, the substrate 10 having the beam structure for manufacturing the SON MOSFET according to the present invention is formed, by controlling doping concentration of the beam through thermal annealing.

Such cavity 12 formed by the beam structure is an area which may be used to form gate, source, and drain electrodes of the MOSFET. The area can be divided into parts by a border layer 10' (see FIG. 3(a)) which is formed on account of not being etched on the substrate 10. That is, the border layer 10' shown in drawings is formed by the beam structure.

<The Process Step of Forming a Gate/Source/Drain Electrode>

Referring FIG. 3 and FIG. 4, FIG. 3a is a side view diagram for representing the substrate formed according to FIG. 1. FIG. 3b is a diagram for representing the process of gate insulating material deposition on the substrate. FIG. 3c is a diagram for representing the process of manufacturing the SON MOSFET by forming the gate, source, and drain electrodes.

As shown in FIG. 3a, the substrate 10 having the beam structure formed according to the previous process step is provided by controlling doping concentration of the beam according to thermal annealing (S21).

As shown in FIG. 3b, the gate insulating material 70 is deposited on the substrate 10 (S22). When the deposition is performed, an accurate alignment process is not necessary for the gate insulating material 70 because it is self aligned in corresponding position due to the beam structure of the substrate.

In this case, $SiO_2$, $Si_3N_4$, $Al_2O_3$, $Y_2O_3$, $ZrO_2$, $HfO_2$, $Ta_2O_5$, $TiO_5$ and so on may be preferably available for the gate insulating material 70.

As shown in FIG. 3c, after the deposition of the gate insulating material 70, the SON MOSFET according to the present invention is formed by deposition of an electrode material 90 for forming the gate, source, and drain electrodes on the gate insulating material 70 (S23, S24).

Here, like the deposition of the gate insulating material 70, the electrode material 90 is also self aligned in corresponding position due to the beam structure of the substrate. Therefore, open connection between electrodes can be earned easily.

Silicon, Polysilicon, Metal or combinations of them may be used for such electrode material 90.

As shown in FIG. 5, the SON MOSFET according to the present invention formed by process steps is a unit device having the SON structure formed with self aligned gate, source, and drain electrodes 92, 94, 96 on the substrate 10 which has the beam structure.

The SON MOSFET according to the present invention provides a simple process of self alignment to fabricate SON structure by forming gate, source and drain electrodes on the beam structure. The lower part of each electrode is closed to the substrate 10 through the gate insulating material 70, thereby leakage current can be blocked. Also, there is an air layer 80 under the border layer 10', and, between the source and drain electrodes 92, 96, which decreases the coupling effect of the gate channel. Accordingly, it is able to minimize the short channel effect.

In result, the SON MOSFET 100 according to the present invention may be applicable to all systems which adapt a logic circuits such as a microprocessor or analogue or mixed-signal circuits such as a ADC/DAC. In general, multiple MOSFET 100 unit devices may be electrically multi connected through wiring each other.

The method of remarkably minimizing the size of device by integrating multiple MOSFETs 100 with a semiconductor process will be described, when multi logic circuit is implemented using a plurality of MOSFET 100 unit devices.

Figure 6:
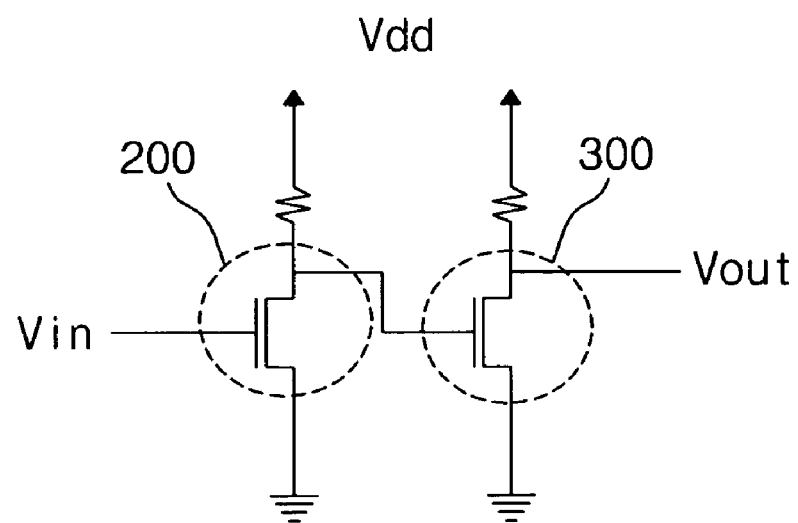
FIG. 6 is a diagram for representing the embodiment of an inverter device by integrating the SON MOSFET according to the present invention.
Figure 6:
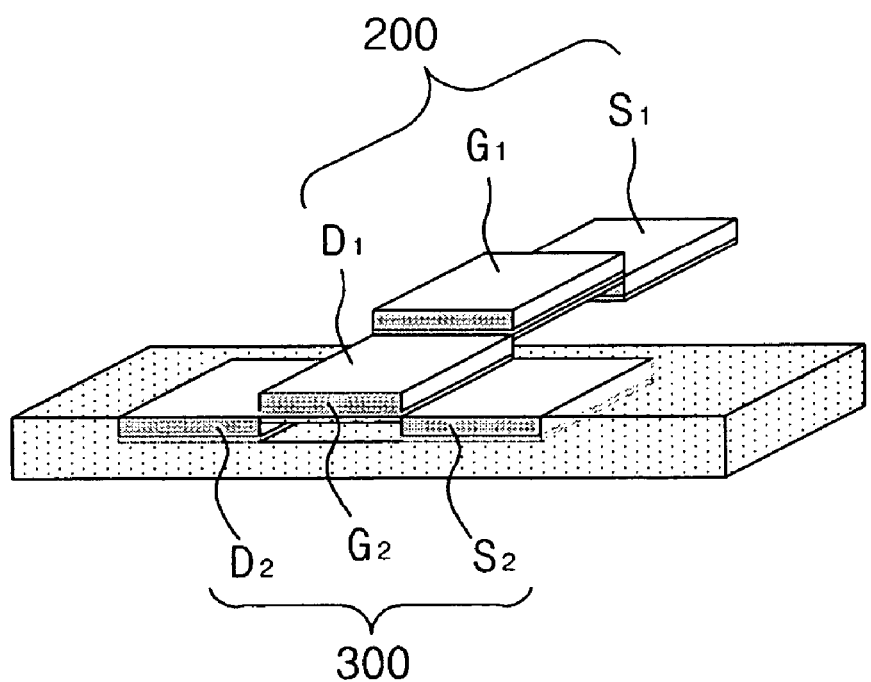
Figure 7:
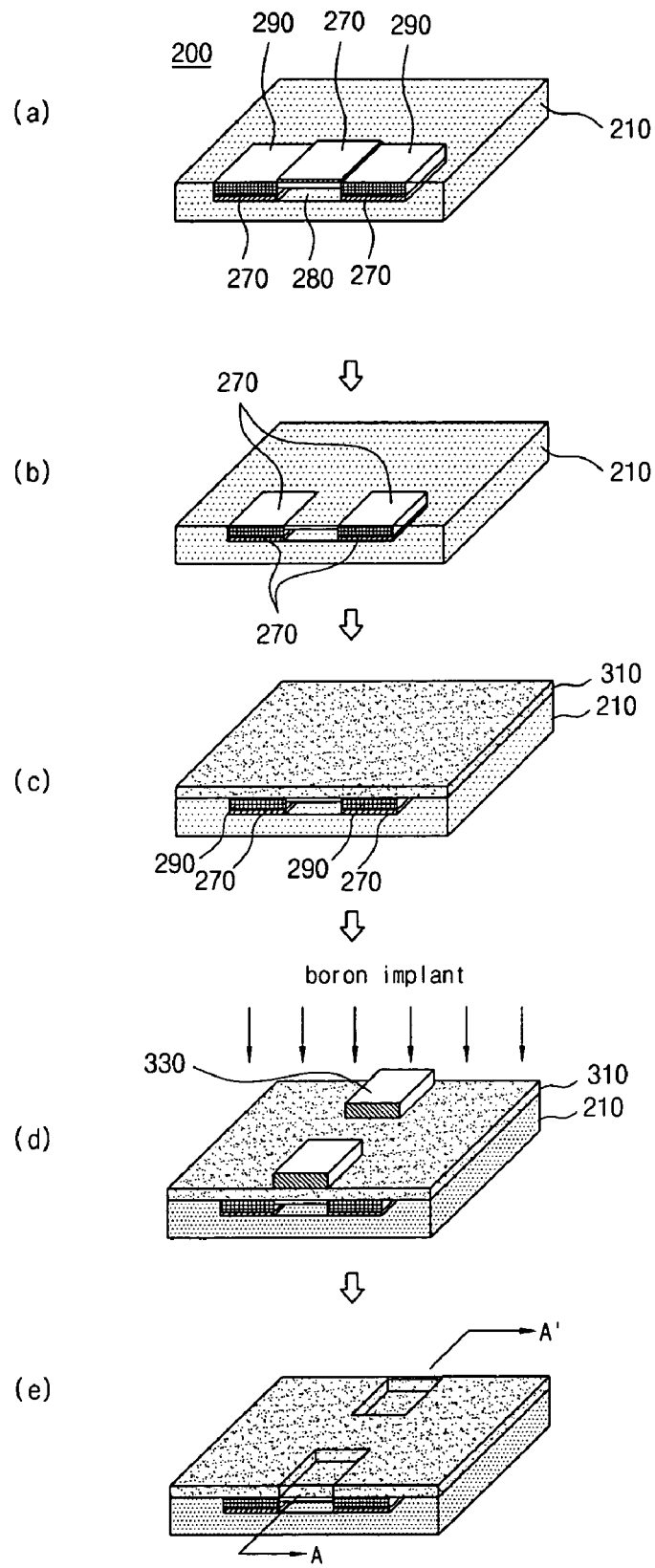
FIG. 7 is a diagram for representing the process of fabricating the second beam structure to implement an inverter with the SON MOSFETs according to the present invention.
Figure 8:
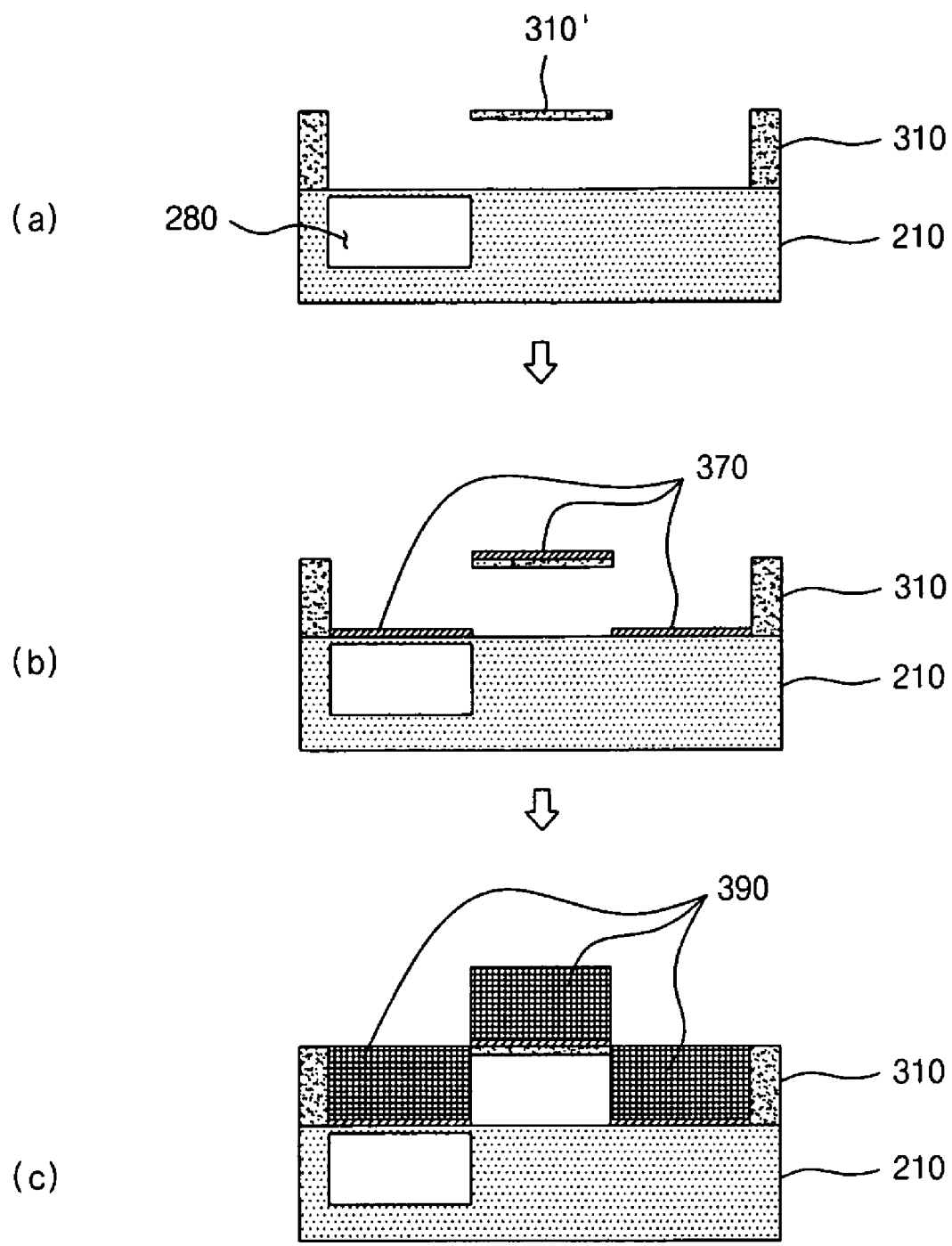
FIG. 8 is a side view diagram for representing an inverter implemented by forming gate, source and drain electrodes on the second beam structure according to FIG. 7.
Figure 9:
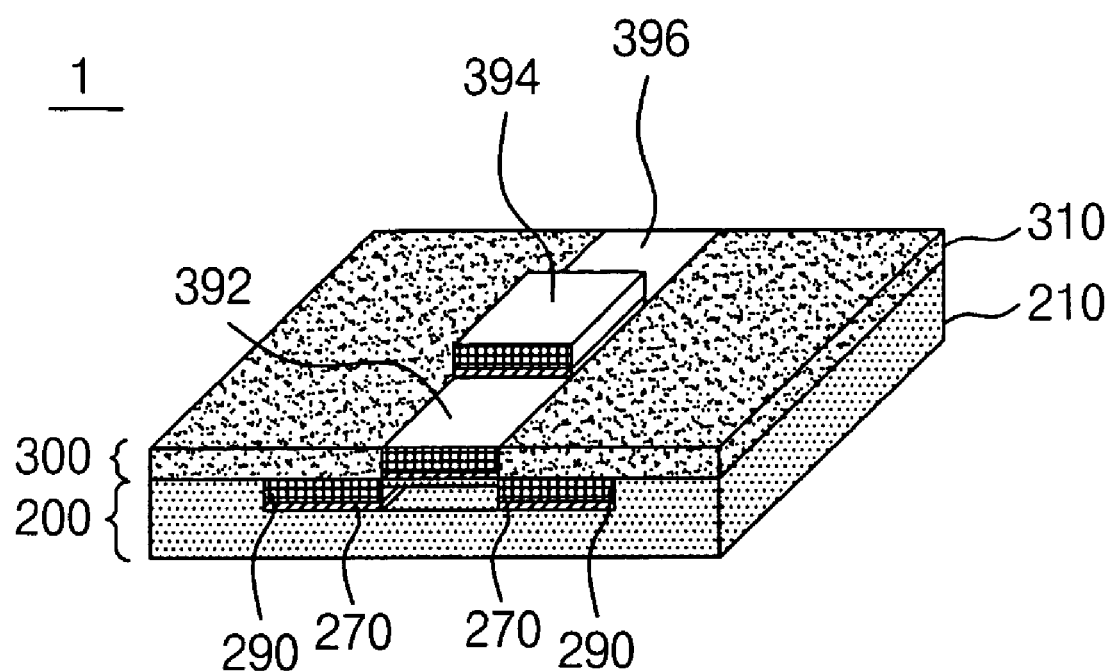
FIG. 9 is a diagram for partly representing an inverter device fabricated according to FIG. 7 and FIG. 8.

FIG. 6 is a diagram for representing the embodiment of an inverter device by integrating the SON MOSFET according to the present invention through the semiconductor process. FIG. 7 is a diagram for representing the process of fabricating the beam structure to implement a multi logic circuit on the SON MOSFET as a unit device according to the present invention. FIG. 8 is a side view diagram for representing the multi logic circuit implemented by forming the gate, source and drain electrodes on the beam structure according to FIG. 7. FIG. 9 is a diagram for partly representing the inverter device fabricated according to FIG. 7 and FIG. 8.

Referring to FIG. 6, FIG. 6(*a*) is a circuit diagram representing an inverter made by electrically interconnecting two MOSFETs 200, 300. As shown, the drain electrode of the front MOSFET 200 is interconnected to the gate electrode of the rear MOSFET 300, which inputs the output signal from the drain electrode of the front MOSFET 200 to the gate electrode of the rear MOSFET 300.

According to the interconnection of circuits, on the semiconductor process, the inverter device made by integrating two MOSFETs 200, 300 may be implemented by conforming the drain electrode D1 of the front MOSFET 200 with the gate electrode G2 of the rear end MOSFET 300.

That is, as shown in FIG. 6*b*, the source electrode S1, gate electrode G1, and drain electrode D1 may be successively formed from the back side of the front MOSFET 200. And, the drain electrode D2 and source electrode S2 of the rear MOSFET 300 are formed in both sides of the drain electrode D1. And, the drain electrode D1 of the front MOSFET 200 is coupled with the gate electrode G2 of the rear MOSFET 300. That is, the drain electrode D1 of the front MOSFET 200 is the gate electrode G2 of the rear MOSFET 300.

The inverter device 1 in FIG. 9 having such structure can improve the efficiency by reducing parasitic capacitance and parasitic resistance component generated by the interconnection between two MOSFET unit devices in the conventional technology using wiring.

The method of manufacturing the inverter device is as follows.

Referring FIG. 7, as shown in FIG. 7*a*, the deposition of the gate insulating material 270 is performed on the lower substrate 210 having the beam structure before complete the SON MOSFET.

Then, the electrode material 290 is deposited on the gate insulating material 270, while it is not deposited on the upper part of border layer 210' on the beam structure, but it is only deposited in both sides. Thus, two electrodes may be formed.

As shown in FIG. 7*b*, FIG. 7*c*, a wafer 310 different from the lower substrate 210 may be formed by eliminating the gate insulating material 270 deposited on border layer 210' on the beam structure, and by depositing silicon having the same size as lower substrate 210.

It is preferable that the height of the wafer 310 is set as much as the height of the MOSFET unit device for better conformation of MOSFETs.

Then, after forming a passivation layer 330 on the wafer 310, the passivation layer is patterned. Also, a doping is performed on the wafer 310 by implantation of diffusion of boron. Then, the patterned passivation layer 330 is removed.

The beam structure having U shaped cavity is formed by anisotropy etching on the region that boron is not doped in the wafer 310. In this case, the beam structure is also the region for forming the gate, source and drain electrodes of the SON MOSFET. Preferably, it should be formed perpendicular to the beam structure formed in the lower substrate 210.

As shown in FIG. 7*e* and FIG. 8*a*, when the wafer is performed etching, it is preferable to establish a common electrode between the electrode formed on the lower substrate 210 and the electrode formed on the wafer 310, by fully etching for the surface of the lower substrate 210 to be exposed.

In the meantime, FIG. 8*a* is a drawing in section which is sectioned according to line A-A' of FIG. 7*e*.

As shown in FIG. 8*a*, the electrode material 390 for forming the gate, source and drain electrodes is deposited, after the deposition of the gate insulating material 370 is performed on the wafer 310 having the beam structure. Hence, the inverter device 1 in FIG. 9 which is composed by conforming and integrating two MOSFETs may be formed.

In this case, additional accurate alignment process is not necessary, because the gate insulating material 370 and the electrode material 390 are self aligned due to the beam structure of the wafer 310.

As described above, $SiO_2$, $Si_3N_4$, $Al_2O_3$, $Y_2O_3$, $ZrO_2$, $HfO_2$, $Ta_2O_5$, and $TiO_5$ may be used as the gate insulating material 370, and Silicon, Polysilicon, Metal or combinations of them may be used as the electrode material 390 for forming the gate/source/drain electrode.

As shown in FIG. 9, the gate electrode of the MOSFET 200 formed in the lower substrate 210 conforms with the drain electrode 392 of the MOSFET 300 formed in the wafer 310. Hence, FIG. 9 shows the structure that two MOSFETs 200, 300 are integrated like one device. The numerals 394, 396 not explained represent the gate electrode and source electrode, respectively.

Accordingly, the size of the device could be remarkably reduced by integrating many devices in a single process.

As described above, the fabrication process for the multi logic circuit according to the present invention was explained with the embodiment of an inverter device that performs an inverter function by integrating two MOSFETs. However, the present invention is not limited to an inverter, but may be used as an analogue/mixed-signal circuit such as an amplifier, or an all logic circuit such as, for example, an AND, NAND, OR, NOR, EXOR, MULTIPLEXER, ALU, LATCH, or FLIP-FLOP circuit based on the process as described for the inverter.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating a SON MOSFET using a beam structure comprising the steps of:
    (a) patterning a passivation layer on a substrate;
    (b) doping boron on the substrate by diffusion or implantation;
    (c) removing the patterned passivation layer;
    (d) forming the beam structure in the substrate by anisotropical etching on a region of the substrate not doped with boron;
    (e) depositing an insulating material on the substrate having the beam structure; and
    (f) depositing an electrode material on the deposited insulating material.

2. The method of claim 1, wherein step (d) includes a bulkmicromachining process that etches a U shaped cavity in the substrate for forming the gate/source/drain electrodes of the SON MOSFET.

3. The method of claim 1, wherein the insulating material comprises at least one of $SiO_2$, $Si_3N_4$, $Al_2O_3$, $Y_2O_3$, $ZrO_2$, $HfO_2$, $Ta_2O_5$, and $TiO_5$.

4. The method of claim 1, wherein the electrode material comprises at least one of silicon polysilicon, or metal.

5. A SON MOSFET manufactured in accordance with the method of claim 1.

6. A method for fabricating a SON MOSFET comprising:
    (a) forming a passivation layer on a surface of a substrate;
    (b) patterning the passivation layer so that a first area and a second area of the surface of the substrate remain covered by the passivation layer, the first area and second areas separated from one another and surrounded by an exposed area of the surface of the substrate, the exposed area including a third area between the first and second areas;
    (c) doping the exposed area of the surface of the substrate with boron;
    (d) removing the passivation layer from the first and second areas, wherein the first and second areas are not doped with boron;
    (e) etching the substrate at the first and second areas so that a U-shaped cavity is formed in the substrate and the third area forms a beam structure;
    (f) depositing an insulating material on the substrate having the beam structure; and
    (g) depositing an electrode material on the deposited insulating material.

7. The method of claim 6 wherein the etching is an anisotropical etching.

8. The method of claim 6 wherein steps (f) and (g) result in source and drain electrodes of the SON MOSFET being formed in the U-shaped cavity on opposite sides of the beam structure and a gate electrode of the SON MOSFET being formed atop the beam structure, and wherein a space exists below the beam structure.

9. The method of claim 8 wherein the space decreases a coupling effect, thereby minimizing a short channel effect.

10. The method of claim 8 wherein the beam structure is flush with the surface of the substrate and is connected at both ends to a main body of the substrate.

* * * * *